United States Patent [19]
Rümmeli et al.

[11] Patent Number: 5,991,606
[45] Date of Patent: *Nov. 23, 1999

[54] APPARATUS FOR FILTERING SIGNALS OF AN ANTENNA ARRANGEMENT AND A SENDER/RECEIVER ARRANGEMENT WITH TWO OR MORE ANTENNAE

[75] Inventors: Bernd Rümmeli, Strande; Olaf Mann, Starnberg, both of Germany

[73] Assignee: RR Elektronische Geräte GmbH & Co., Kiel-Friedrichsort, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 07/990,771

[22] Filed: Dec. 7, 1992

[30] Foreign Application Priority Data

Dec. 7, 1991 [DE] Germany ............... 91 15 204 U

[51] Int. Cl.$^6$ ............................................. H04B 1/48
[52] U.S. Cl. ................. 455/78; 455/82; 455/283; 455/120; 333/132; 333/126

[58] Field of Search .................. 455/82, 77, 78, 455/83, 80, 290, 291, 280–283, 286.7, 120, 121, 124; 333/132, 126, 129; 370/36–38, 40, 32, 24, 278, 339

[56] References Cited

U.S. PATENT DOCUMENTS

| | | | |
|---|---|---|---|
| 3,656,162 | 4/1972 | Mee | 370/339 |
| 4,095,229 | 6/1978 | Elliot | 455/82 X |
| 5,023,866 | 6/1991 | DeMuro | 370/278 |
| 5,170,493 | 12/1992 | Roth | 333/132 X |
| 5,212,815 | 5/1993 | Schumacher | 455/80 X |

*Primary Examiner*—Wellington Chin
*Assistant Examiner*—Philip J. Sobutka
*Attorney, Agent, or Firm*—Darby & Darby

[57] ABSTRACT

A pair of filter units directs incoming signals from an antenna and outgoing signals to the antenna. One of the filter units blocks the outgoing signals and passes the incoming signals while the other of the filter units blocks the incoming signals and passes the outgoing signals.

10 Claims, 3 Drawing Sheets ously carry out a transmitting and receiving operation at different frequencies over a common antenna. The receiving filter largely prevents outgoing signals from reach

APPARATUS FOR FILTERING SIGNALS OF AN ANTENNA ARRANGEMENT AND A SENDER/RECEIVER ARRANGEMENT WITH TWO OR MORE ANTENNAE

BACKGROUND OF THE INVENTION

The invention relates to an apparatus for filtering the signals of an antenna arrangement having at least one antenna and a sender/receiver arrangement with two or more antennae.

FIELD OF THE INVENTION

Such apparatus are used, for example, in mobile radio applications. Particularly in maritime radio locations, it is necessary, as a rule, that reception in several frequencies be possible simultaneously with transmission. In maritime radio locations, for instance, reception of radiolocation, meteorological broadcasts, etc. is required. Moreover, it is frequently desired to also be able to receive radio and TV programs. Information exchange between the mobile location and other radio stations normally takes place on VHF maritime radio frequencies. Most recently, in addition, a mobile telephone which transmits and receives on the C or D radio network is frequently desired.

For each radio function, it is conventional to use an individual antenna which is dimensioned in accordance with the requirements. It is also known to use antennae which have a broadband frequency characteristic and are provided with following frequency diplexers or filters. Additionally, it is also possible, in principle, to provide switchable frequency characteristics.

With the normal use of several antennae each of which has a specific frequency assigned thereto, both spatial and mechanical problems occur during installation due to the large number of required antennae. Moreover, the antennae influence one another during transmission and reception. With switchable frequency characteristics, it is not possible to simultaneously carry out a receiving and transmitting operation via a single antenna.

SUMMARY OF THE INVENTION

It is accordingly an object of the present invention to construct an apparatus of the type mentioned initially in such a manner that a broadband reception and a narrow-band transmitting procedure can be performed simultaneously over one and the same antenna.

According to the invention, this object is achieved by the provision of at least one receiving filter which largely impedes the outgoing signals forwarded to the antenna arrangement.

Advantageous designs of the invention are set forth in the dependent claims.

Due to the dimensioning of the receiving or transmitting filter in accordance with the invention, it is possible to simultaneously carry out a transmitting and receiving operation at different frequencies over a common antenna. The receiving filter largely prevents outgoing signals from reaching the region of the receiver. An additional transmitting filter, in turn, prevents incoming signals which, as a rule, are distinctly weaker than the outgoing signals, from being able to reach the region of a transmitting generator. The respective desired bandwidth can be set by a dimensioning of the filters which is matched to the respective application.

According to a preferred embodiment of the invention, a common terminal is provided for the infeed and the uncoupling of outgoing and incoming signals. The receiving and transmitting filter of the apparatus in accordance with the invention are connected essentially in parallel with one another. By virtue of this structural split, it is possible, for example, to divide the receiving filter and to connect an amplifier for the received signal between the parts of the receiving filter. An active antenna, in which an impingement of the amplifier by outgoing signals is prevented, thereby is made available.

In another preferred embodiment, the receiving filter as well as the transmitting filter are made of inductances or capacitors. It is further of advantage to construct a transmitting filter as a series resonant circuit and the parts of the receiving filter as a parallel resonant circuit. In this manner, it is possible to achieve a transmitting action for specific frequencies and a blocking action for the other frequencies by means of simple electronic components in particularly economical fashion.

BRIEF DESCRIPTION OF THE DRAWINGS

Additional details of the present invention are forthcoming from the following detailed description and the annexed drawings in which preferred embodiments of the invention are illustrated by way of example.

In the drawings there is shown.

DESCRIPTION OF THE PREFERRED EMBODIMENTS

Figure 1:
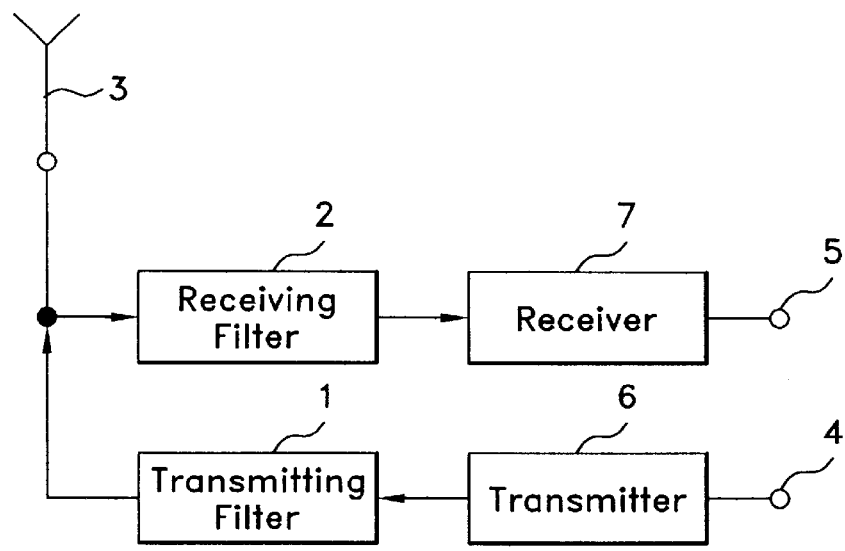
FIG. 1: a block circuit diagram of an antenna which is provided with a transmitting filter and a receiving filter
Figure 2:
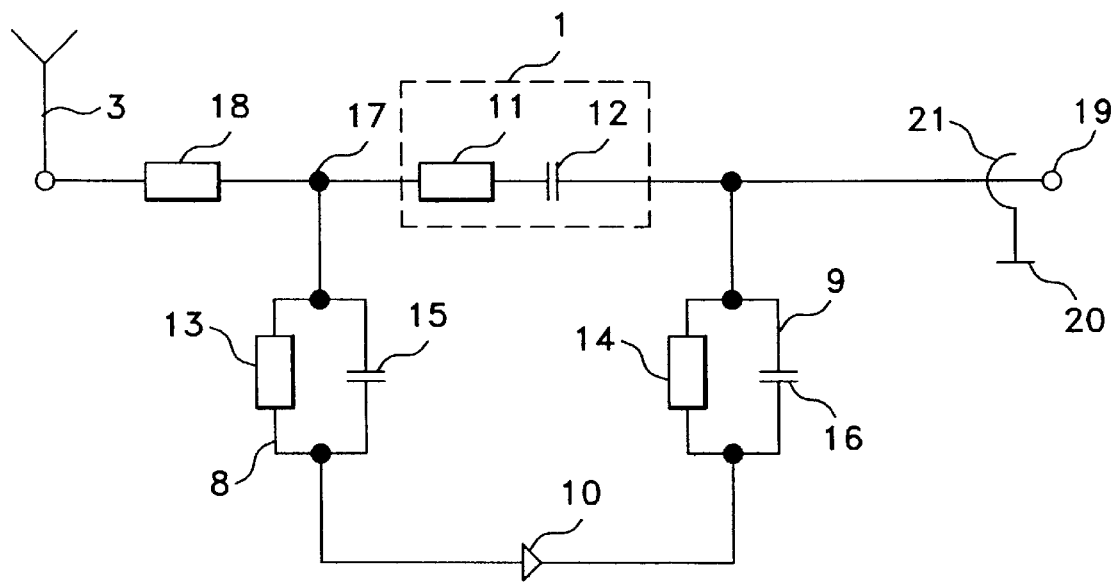
FIG. 2: a circuit diagram of an antenna filter in which both series and parallel resonant circuits are used and an amplifier is provided for amplification of the incoming signals

An apparatus for filtering outgoing and incoming signals consists essentially of a transmitting filter 1 and a receiving filter 2. Both the transmitting filter 1 and the receiving filter 2 are connected to an antenna 3. In an embodiment with a separate input 4 as well as a separate output 5, the transmitting filter 1 is supplied by a transmitter 6 and the signals issued by the receiving filter 2 are conducted to a receiver 7. The signals to be transmitted can be admitted into the region of the transmitter 6 via the input 4 and, under certain circumstances, here undergo a required modulation. The incoming signals processed by the receiver 7 can be taken off at the output 5.

To construct an active antenna, it is particularly advantageous to split up the receiving filter 2 into partial filters 8,9. An amplifier 10 is arranged between the partial filters 8,9. By means of the partial filters 8,9, portions of the outgoing signal are prevented from being able to reach the region of the input or output of the amplifier.

The transmitting filter 1 is constructed as a series resonant circuit which consists of an inductance 11 and a capacitor 12. The receiving filter 2 and the partial filters 8,9 consist of parallel resonant circuits which are made from inductances 13,14 and capacitors 15,16. An impedance transformer 18 is provided between the antenna 3 and a junction 17 where the transmitting filter 1 and the receiving filter 2 are electrically connected to one another. The impedance transformer 18 can be made of an inductance. A common terminal 19 via which the outgoing signals can be forwarded and the incoming signals taken off is provided with a shield 21 connected to a ground 20.

For operation of the apparatus, the transmitting filter 1 is advantageously tuned for a narrow band and the receiving filter 2 for a broad band. Outgoing signals are conducted to the antenna 3 via the impedance transformer 18 and the transmitting filter 1 which, for the transmitting frequency, acts essentially as a short circuit. Instead of constructing the impedance transformer 18 from an inductance, it is also possible to use suitable networks which have inductances or capacitors and, alternatively or additionally, are provided with line transformers. In particular, the impedance transformer 18 serves to adjust the antenna 3 to a feed cable impedance. The feed cable is connected to the terminal 19.

Received signals are forwarded to an input of the amplifier 10 over the impedance transformer 18 and the partial filter 8. The partial filter 8 has a very low resistance for the receiving frequencies. In contrast, the transmitting filter 1 acts as a high impedance for the receiving frequencies. The incoming signal conveyed through the amplifier 10 is conducted into the region of the terminal 19 via the second partial filter 9. A self-excitation of the amplifier 10 is prevented by the combination of the partial filters 8,9 and the transmitting filter 1.

When using a common terminal 19 for both the outgoing and incoming signals, suitable band-stop or bandpass filters for signal separation are used in the region of a terminal unit 20 which is connected to the terminal 19 by means of the feeder. For supplying energy to the amplifying part, it is particularly contemplated to provide a remote dc supply.

For use in the maritime radio field, it is possible, for example, to dimension the transmitting filter 1 and the receiving filter 2 such that a transmitting operation in the two meter range is feasible. By a matched dimensioning of the receiving filter 2, a broadband receiving operation in an expanded longwave interval up to the three meter range is possible.

Aside from use in the already mentioned maritime radio field, a large number of other applications are also conceivable. For instance, it is possible to arrange the apparatus in motor vehicles which are equipped with suitable communication devices. Also conceivable are applications in the mobile radio field as well as for cordless telephones and car phones. Fundamentally, an application can also be effected, however, in all other transmission systems which, for signal transmission, use a carrier medium having different frequencies for outgoing and incoming signals.

Figure 3B:
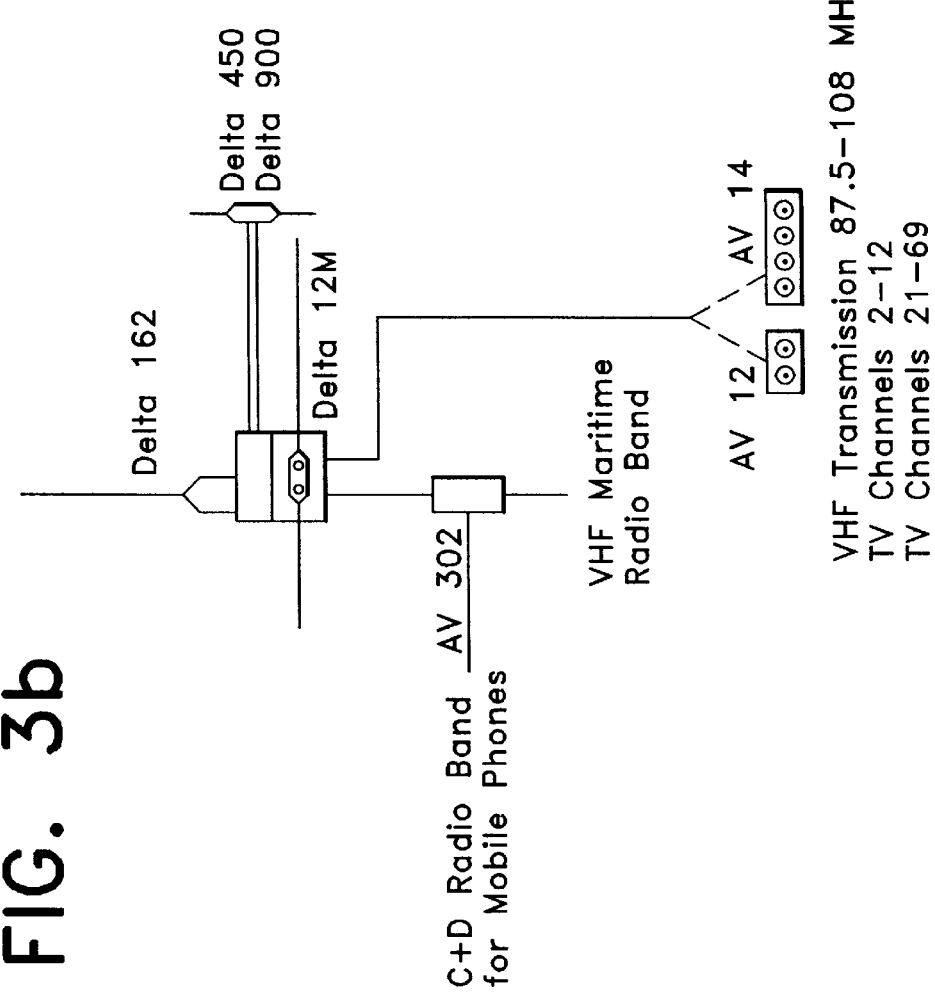
FIGS. 3a to d: four system sketches from which transmitting and receiving antenna combinations in conjunction with VHF maritime radios can be seen.
Figure 3A:
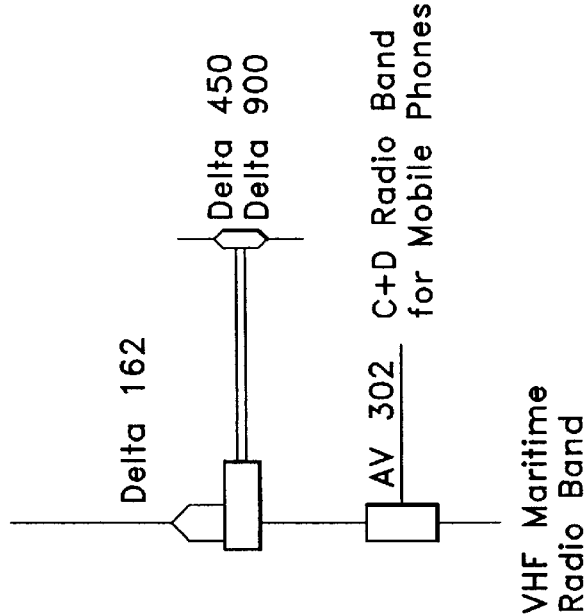
Figure 3D:
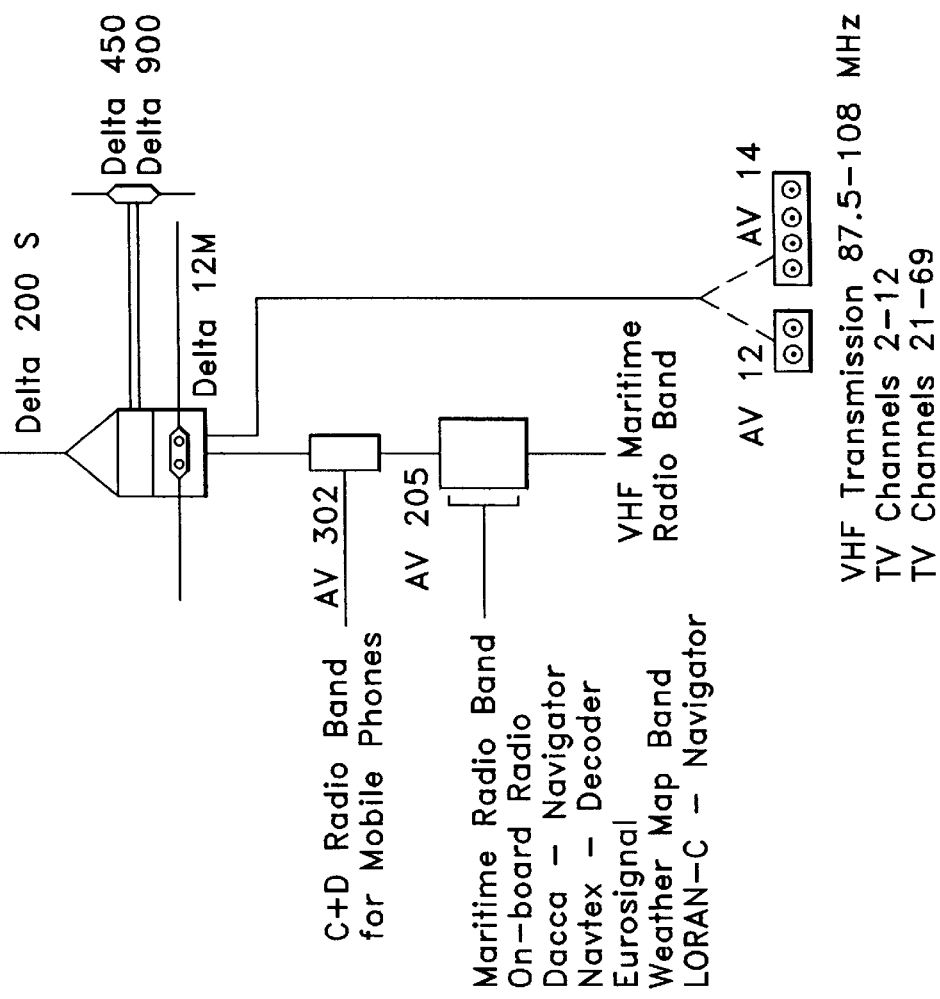
Figure 3C:
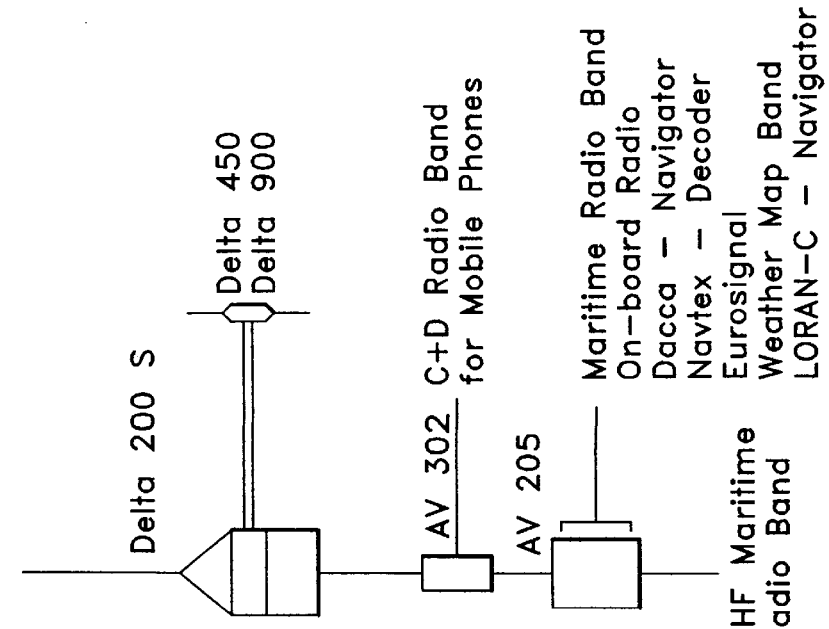

As seen particularly from FIGS. 3a to d, it has been found advantageous in practice to provide two corresponding, separate antennae when a transmitting and receiving operation on mobile radio frequencies in the C or D system is to be carried out in addition to the transmitting and receiving operation on the maritime radio frequencies. In this antenna arrangement, a common feeder is provided for both antennae. In the feeder, one or more of the apparatus according to the invention, depending upon the application, can then be connected in series with one another and with the feeder. This results in the creation of branches at each of which an incoming signal of different frequency is uncoupled. Furthermore, corresponding outgoing signals can also be coupled into the feeder of the antenna arrangement at the locations where VHF, maritime radio or mobile telephone signals are uncoupled. At the locations where signals for aircraft radios, Dacca navigation, Navtex signals, Euro signals, weather map signals or LORAN-C signals are uncoupled by means of the apparatus according to the invention, only a receiving operation is provided so that signals corresponding to a sending operation are not present. Accordingly, a transmitting filter can be omitted at such locations.

In addition, it can be meaningful in practice to use an antenna arrangement having a maritime radio antenna, a mobile radio antenna and a TV and radio broadcast antenna. Under certain circumstances, an apparatus in accordance with the invention can be omitted in the separate feeder for the radio broadcast and TV antenna.

What is claimed is:

1. An apparatus for processing incoming and outgoing signals from and to at least one antenna, respectively, comprising:

at least one receiving filter means for significantly impeding at least the outgoing signals and including at least one parallel resonant circuit having a resonant circuit input connected to the at least one antenna and a resonant circuit output connected with an amplifier, the at least one parallel resonant circuit including first and second broadband filters tuned for passing receiving frequencies;

at least one transmitting filter means including a narrowband filter tuned for passing transmitting frequencies, wherein the at least one transmitting filter means has a high impedance for the receiving frequencies; and wherein the amplifier of said at least one parallel resonant circuit is connected between the pair of broadband filters.

2. The apparatus of claim 1, wherein said amplifier has a first amplifier input and an amplifier output, said first broadband filter having a broadband filter output connected to said first amplifier input and said second broadband filter having a broadband filter input connected to said amplifier output.

3. The apparatus of claim 2, wherein said broadband filters are designed to prevent the outgoing signals from arriving at said amplifier.

4. The apparatus of claim 2, wherein said broadband filters are designed to pass the incoming signals largely unimpeded, said first broadband filter having an input for the incoming signals and said second broadband filter having an output for the incoming signals so that the incoming signals pass through said first broadband filter to said amplifier and, following amplification, through said second broadband filter to said output thereof.

5. The apparatus of claim 1, wherein a first one of the at least one receiving filter means includes a first broadband filter having a first filter input and a first filter output, and a second broadband filter having a second filter input and a second filter output, wherein the at least one transmitting filter means is disposed between said second filter output and said first filter input.

6. The apparatus of claim 5, wherein the first receiving filter means has the first input arranged to receive the incoming signals.

7. The apparatus of claim 5, wherein the at least one receiving filters and the first and second broadband filters thereof and the at least one transmitting filter are configured so as to prevent self-excitation by signals emitted by said amplifier.

8. The apparatus of claim 1, wherein the at least one transmitting filter means is designed to pass frequencies in the VHF maritime band, or the C or D band for mobile telephones.

9. The apparatus of claim 1, further comprising a common terminal connected to the at least one receiving filter means and the at least one transmitting filter means for providing an infeed of the outgoing signals and an outfeed of the incoming signals.

10. The apparatus of claim 1, wherein said at least one receiving filter means is designed to pass signals in the VHF maritime radio band, aircraft radio band, Dacca navigation band, Navtex band, Euro band, weather map band, LORAN-C band, C radio band for mobile telephones, D radio band for mobile telephones, VHF radio broadcast band or TV broadcast band.

* * * * *